(12) United States Patent
Grand

(10) Patent No.: US 8,675,280 B2
(45) Date of Patent: Mar. 18, 2014

(54) WAVELENGTH OPTICAL FILTER STRUCTURE AND ASSOCIATED IMAGE SENSOR

(75) Inventor: Gilles Grand, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 204 days.

(21) Appl. No.: 13/124,007

(22) PCT Filed: Oct. 20, 2009

(86) PCT No.: PCT/EP2009/063750
§ 371 (c)(1),
(2), (4) Date: Apr. 13, 2011

(87) PCT Pub. No.: WO2010/046369
PCT Pub. Date: Apr. 29, 2010

(65) Prior Publication Data
US 2011/0204463 A1    Aug. 25, 2011

(30) Foreign Application Priority Data

Oct. 22, 2008  (FR) ...................... 08 57157

(51) Int. Cl.
*G02B 1/10* (2006.01)
(52) U.S. Cl.
USPC ............................ 359/587; 359/585; 359/588
(58) Field of Classification Search
USPC ................. 359/360, 585, 580, 247, 587, 588; 428/457
See application file for complete search history.

(56) References Cited

U.S. PATENT DOCUMENTS

| | | | |
|---|---|---|---|
| 2,769,111 A | | 10/1956 | Sadowsky |
| 5,189,551 A | * | 2/1993 | Woodard ...................... 359/360 |
| 5,591,529 A | * | 1/1997 | Braatz et al. .................. 428/457 |
| 6,031,653 A | * | 2/2000 | Wang ............................ 359/247 |
| 2006/0205107 A1 | | 9/2006 | Inaba et al. |
| 2007/0146888 A1 | | 6/2007 | Schmidt et al. |
| 2009/0302407 A1 | | 12/2009 | Gidon et al. |
| 2011/0043823 A1 | | 2/2011 | Hillmer et al. |

FOREIGN PATENT DOCUMENTS

| | | |
|---|---|---|
| EP | 1 592 067 A1 | 11/2005 |
| FR | 2 904 432 | 2/2008 |
| WO | WO 2008/017490 A2 | 2/2008 |

OTHER PUBLICATIONS

International Search Report issued Nov. 30, 2009, in Patent Application No. PCT/EP2009/063750.

\* cited by examiner

*Primary Examiner* — Audrey Y Chang
(74) *Attorney, Agent, or Firm* — Oblon, Spivak, McClelland, Maier & Neustadt, L.L.P.

(57) ABSTRACT

The invention relates to an optical filter structure composed of at least two adjacent elementary optical filters, an elementary optical filter being centred on an optimum transmission frequency, characterised in that it comprises a stack of n metallic layers (m1-m3) and n−1 dielectric layers (d2-d3), each metallic layer alternating with a dielectric layer such that the central layer in the stack is a metallic layer (m2), each of the layers in the stack having a constant thickness except for the central metallic layer for which the varying thickness fixes the optimum transmission frequency of an elementary filter.

15 Claims, 7 Drawing Sheets

WAVELENGTH OPTICAL FILTER STRUCTURE AND ASSOCIATED IMAGE SENSOR

TECHNICAL FIELD AND PRIOR ART

The invention relates to a wavelength optical filter structure and an image sensor that comprises an optical filter structure according to the invention.

The invention has a particularly advantageous application for making small image sensors, for example such as image sensors for miniature cameras in mobile telephones.

The need for image capture by electronic sensors is expanding quickly. The demand for simplified manufacturing of these sensors continues to be very strong. CCD (Charge Coupled Device) sensors are progressively being replaced by CMOS technology-based APS (Active Pixel Sensor) sensors.

One important problem to be solved in making an image sensor is to obtain colours. It is known that most colours can be saved and then reproduced starting from three colours in the visible spectrum (namely red, green and blue).

Some equipment begins by separating the three colours and then guiding them to three image sensors. Other equipment directly separates the colours on the surface of a single matrix of detectors: this invention relates to the second type of sensors.

Two options can be envisaged for this second type of sensor:
  either a very complex detection matrix can be built with several structural layers, using the fact that the different colours do not penetrate to the same depth in the material in which photons are converted into electrons (photo-site);
  or sets of filters can be added in matrix form on the surface of a matrix of detectors.

The second option (addition of sets of filters) is the most frequently used. The most conventional matrix is then a matrix commonly called the Bayer matrix.

FIG. 1 shows a top view of an example of a Beyer matrix. The Bayer matrix shown in FIG. 1 is a 2×2 matrix (two rows×two columns). From left to right, the filters in row 1 are green and red filters respectively, and the filters in row 2 are blue and green filters respectively. Throughout the remainder of this description, "Green filter" means any element that is practically transparent for green and practically opaque for all other colours in the visible spectrum. Similarly, "Blue filter" and "Red filter" refer to elements that are practically transparent for blue and red respectively, and are practically opaque for all other colours in the visible spectrum.

Such a filter matrix is conventionally made by the use of coloured resins. In order to facilitate manufacturing of the filter matrix, resins photosensitive to ultraviolet rays and that can be eliminated in a developing bath at locations at which they have not been insolated are frequently used. For example, a Bayer matrix according to prior art is made by depositing three resin layers in sequence, one for Green, one for red and one for Blue. For each deposition, each resin is insolated through a mask and is developed so that it remains only in the required positions.

The diagram in FIG. 2 represents a simplified structure of an APS CMOS sensor according to prior art. The APS CMOS sensor comprises a photosensitive semiconducting element 1, for example silicon, on the surface of which photosensitive zones Zph and electronic circuits E1 are formed, a silica layer 2 in which electrical interconnections 3 are integrated connecting the electronic circuits E1 to each other, resin layers forming Blue filters B, Red filters R and Green filters V, a resin layer 4 and a set of micro-lenses MC.

This technique for making sensors is now well controlled. However, one disadvantage of this sensor is that it cannot eliminate infrared. Therefore, a glass sheet with a multi-layer interference filter has to be added above the sensor after manufacturing to eliminate the infrared.

Furthermore, the resins are not very dense, and at the moment a resin thickness of at least approximately one micron has to be added to obtain sufficient filtering. The size of pixels in recent image sensors is approximately one micron (typically 2 µm). This pixel dimension then creates a problem for rays arriving at a high angle of incidence on the sensor surface (edge of image or large objective aperture). Photons that pass through one filter can then finish their travel distance in the photo-site of the adjacent filter. This phenomenon severely limits miniaturisation.

Coloured resins are also known as being easily non-homogenous. The non-homogeneity of filtering is then particularly marked if the pixels are small. This also is another disadvantage.

There are also absorbing materials other than resins, but although these materials may be more absorbent, they introduce too many manufacturing problems for them to be compatible with the simple production of a matrix of integrated photo-sites, and production then becomes too expensive.

The patent application filed in France by the Applicant on Jul. 25, 2006 and published as No. 2 904 432 proposes an optical filter structure composed of a set of at least two elementary optical filters, one elementary optical filter being centred on an optimum transmission frequency, characterised in that it comprises a stack of n metallic layers and n practically transparent layers that alternate between a first metallic layer and an $n^{th}$ practically transparent layer, each of the n metallic layers having a constant thickness and at least one practically transparent layer with a variable thickness that fixes the optimum transmission frequency of an elementary optical filter, where n is an integer greater than or equal to 2. For example, it is then possible to make the three coloured filters Red, Green and Blue by varying only one or two transparent dielectric layers, the thickness of the metallic layers being constant.

FIGS. 3 and 4 show top and sectional views respectively of a structure divulged in patent application FR 2 904 432. R, G, B filter cells are placed adjacent to each other to select Red, Green, and Blue colours respectively (see FIG. 3). FIG. 4 is a sectional view along line BB in FIG. 3. The structure shown in FIG. 4 comprises four dielectric layers D1-D4 and three metallic layers M1-M3, one metallic layer alternating with one dielectric layer. Layer D1 is in contact with a substrate S and layer D4 is in contact with the incident medium that receives light. Each of the two dielectric layers D1 and D4 has a constant thickness, and each of the three metallic layers M1-M3 has a constant thickness. Each of the two layers D2 and D3 has a variable thickness as a function of the filtering in which they participate. Three filter zones Z1, Z2 and Z3 are then defined as a function of the thickness of the layers for Red, Green and Blue respectively. A transition zone Za separates zones Z1 and Z2 and a transition zone Zb separates zones Z2 and Z3.

Table 1 below gives an example of numeric values of the thicknesses of the different dielectric and metallic layers of the structure in FIG. 4 as a function of the different zones. The notation e(Di) represents the thickness of the layer Di (i=1, 2, 3, 4) and the notation e(Mj) represents the thickness of the layer Mj (j=1, 2, 3). In the example chosen, the dielectric layers are made of titanium oxide (TiO$_2$) and the metallic layers are made of silver (Ag):

TABLE 1

| thickness | Z3 | Z2 | Z1 |
| --- | --- | --- | --- |
| e (D1) | 72.9 nm | 72.9 nm | 72.9 nm |
| e (M1) | 14.1 nm | 14.1 nm | 14.1 nm |
| e (D2) | 47.3 nm | 71.9 nm | 86.8 nm |
| e (M2) | 36.8 nm | 36.8 nm | 36.8 nm |
| e (D3) | 47.5 nm | 71.1 nm | 82.2 nm |
| e (M3) | 14.9 nm | 14.9 nm | 14.9 nm |
| e (D4) | 72.5 nm | 72.5 nm | 105.7 nm |
| Total | 306 nm | 354.2 nm | 413.4 nm |

The number of intermediate dielectric layers with variable thicknesses (layers D2 and D3 in the example in FIG. 4) has an influence on the maximum transmission and on the narrowness of the transmission window: in practice, a coloured filter with a spectral width equal to 100 nm (Blue, Green or Red) typically requires the presence of two intermediate dielectric layers surrounded by two metallic layers and therefore, according to the process described in patent application FR 2 904 432, the formation of a total of seven layers. Four distinct lithograph processes then have to be applied, each lithograph process comprising resin deposition, a lithography step, exposure, development, etching and stripping of residual resin. This is a disadvantage. Furthermore, there are two superposed etchings at each transition between pixels (see zones Za and Zb), which firstly causes a lateral offset related to the alignment precision between the levels, and secondly a thickness offset between the different filters. In the example given above, this offset is of the order of 60 nm (40 to 80 nm) between the Green and Blue filters and of the order of 120 nm between the Red and Blue filters. Transitions between pixels then generate an optical diffraction artefact.

FIGS. 5A and 5B illustrate the intensity I of an optical signal transmitted by a two adjacent pixels structure as a function of the transition type that exists between the two adjacent pixels. FIG. 5A corresponds to an ideal transition between adjacent pixels while FIG. 5B corresponds to a real transition. The ideal transition is a clean transition between pixels that leads to a sudden change in the intensity without disturbance while the real transition is a transition with a change in the thickness and a misalignment that causes a diffraction artefact. This artefact reduces the useful area of each pixel and disturbs signal transmissions. It is then difficult to make very small pixels, for example with dimensions less than 1.5 µm×1.5 µm.

Other optical filter structures are also known in prior art, for example the structures disclosed in U.S. Pat. No. 6,031,653, in patent application EP 1 592 067, in patent application US 2007/0146888 or international patent application WO 2008/017490.

U.S. Pat. No. 6,031,653 discloses an optical filter structure composed of two Fabry-Pérot type cavities superposed on each other that share the same semi-reflecting surface. The optical filter is made by varying the thickness of the dielectric layers placed between semi-reflecting surfaces.

Patent application EP 1 592 067 discloses a multi-layer optical filter structure comprising two multi-layer λ/4 films separated by an insulating layer with a thickness different from λ/4, where λ is the transmission wavelength. The thickness of the insulating layer varies as a function of the wavelength to be transmitted.

Patent application US 2007/0146888 and international patent application WO 2008/017490 each discloses a Fabry-Pérot cavity comprising a dielectric layer placed between two semi-reflecting multi-layer films. The thickness of the dielectric layer varies as a function of the wavelength to be transmitted.

All these documents according to prior art provide information about how to modify the transmission frequency of an optical structure by varying the thickness of the central dielectric layer of a Fabry-Pérot cavity or by varying the thickness of a dielectric layer that separates two λ/4 multi-layer films. The structures disclosed in these documents have several disadvantages. Firstly, these structures are relatively thick and their manufacturing process requires a large number of lithography steps. The transition between two adjacent pixels requires two superposed etchings, which causes a lateral offset due to the inaccuracy of the alignment and consequently a change in thickness between the different filters. The transitions between pixels then generate an optical diffraction artefact. These structures are also incapable of stopping frequencies in the infrared band.

The structure according to the invention does not have the disadvantages mentioned above.

PRESENTATION OF THE INVENTION

The invention relates to an optical filter structure composed of at least two adjacent elementary optical filters, an elementary optical filter being centred on an optimum transmission frequency, characterised in that it comprises a stack of n metallic layers and n−1 dielectric layers where n is an odd integer greater than or equal to 3, each metallic layer alternating with a dielectric layer such that the central layer in the stack is a metallic layer, each of the layers in the stack having a constant thickness except for the central metallic layer for which the varying thickness fixes the optimum transmission frequency of an elementary filter.

According to an additional characteristic of the invention, the thicknesses of the dielectric and metallic layers in the stack located on each side of the central metallic layer and with the same rank relative to the central metallic layer are approximately the same.

According to another characteristic of the invention, the thicknesses of the dielectric and metallic layers in the stack located on each side of the central metallic layer and with the same rank relative to the central metallic layer are not the same, the thickest dielectric and metallic layers being all located on the same side of the central metallic layer.

According to yet another characteristic of the invention, at least one metallic layer in the stack is obtained by superposition of two elementary metallic layers formed from different metallic materials. A first of the two elementary metallic layers called the "bond layer" then enables better bond of the second elementary metallic layer in the stack.

According to yet another characteristic of the invention, the stack metallic layers that are not formed from two elementary metallic layers are made from silver and the second elementary metallic layer of the stack metallic layers obtained by the superposition of two elementary metallic layers is also made from silver.

According to yet another characteristic of the invention, at least one dielectric layer in the stack is obtained by superposition of at least two elementary dielectric layers formed from different materials. A first elementary dielectric layer located between a metallic layer and the second elementary dielectric layer is an interface layer that can avoid a chemical reaction between the metal of the metallic layer and the second elementary dielectric layer and/or forms a barrier to diffusion of the metal in the metallic layer in the dielectric.

According to yet another characteristic of the invention, the dielectric layers that are not obtained by the superposition of two elementary dielectric layers and the second elementary dielectric layer of the two elementary dielectric layers in each dielectric layer formed from two elementary dielectric layers are made for example from one of the following materials: titanium dioxide ($TiO_2$), titanium-doped aluminium nitride (AlTiN), zinc sulphide (ZnS), Zinc sulphide-Silica alloy (ZnS(x)-$SiO_2$(1-x), alumina ($Al_2O_3$) silicon nitride ($Si_xN_y$), magnesium fluoride ($MgF_2$).

According to yet another characteristic of the invention, a first dielectric optical adaptation layer is placed on the metallic layer located at a first end of the stack and/or a second dielectric optical adaptation layer is placed on the metallic layer located at a second end of the stack, opposite the first end. The first dielectric adaptation layer placed at the bottom of the stack is then a dielectric layer that can optically adapt the index between the stack and a substrate on which the stack is placed. Similarly, the second dielectric adaptation layer placed on the surface of the stack is then a dielectric layer capable of optically adapting the index between the stack and a superstrate that overlies the stack. For example the superstrate may be air.

According to yet another characteristic of the invention, the thickness of the first dielectric adaptation layer and/or the second dielectric adaptation layer varies from at least one first elementary optical filter to at least one second elementary optical filter.

According to yet another characteristic of the invention, the first and second dielectric adaptation layers are made from exactly the same material as is used for the dielectric layers in the stack.

According to yet another characteristic of the invention, the elementary optical filters are arranged in the form of a matrix.

According to yet another characteristic of the invention, the matrix is a Bayer matrix for filtering the three colours Red, Green and Blue.

The invention also relates to an optical sensor comprising an optical filter structure and a photosensitive semiconductor substrate on which the optical filter structure is deposited, characterised in that the optical filter structure is a structure according to the invention, a metallic layer at one end of the stack or the first dielectric adaptation layer being fixed on a first face of the semiconducting substrate.

According to yet another characteristic of the invention, when the optical filter structure is an asymmetric structure such that the thickest dielectric and metallic layers are all located on the same side of the central metallic layer, the thinnest dielectric and metallic layers in the stack are placed between the first face of the semiconducting substrate and the central metallic layer.

Advantageously, an optical filter structure according to the invention, for example a Bayer matrix, may be such that all elementary optical filters of the matrix that form the structure are thinner than the shortest of the useful wavelengths.

BRIEF DESCRIPTION OF THE FIGURES

Other characteristics and advantages of the invention will become clear after reading the preferred embodiments made with reference to the attached figures among which.

The same references denote the same elements on all figures.

DETAILED DESCRIPTION OF EMBODIMENTS OF THE INVENTION

Figure 1:
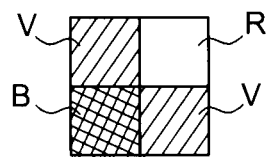
FIG. 1, already described, shows a top view of a Bayer matrix according to prior art.
Figure 2:
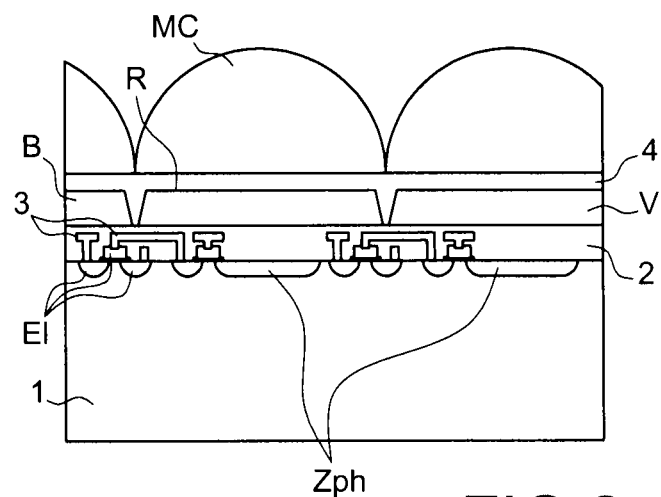
FIG. 2, already described, shows a sectional view of an APS CMOS sensor according to prior art.
Figure 3:
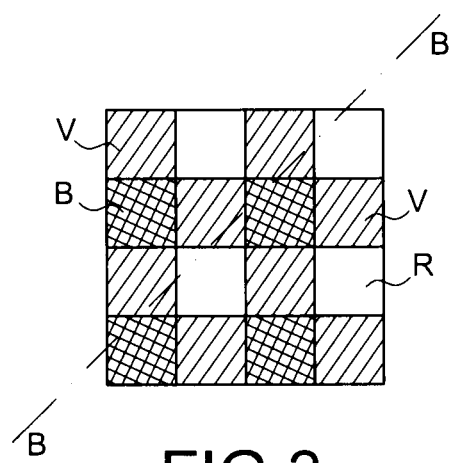
FIG. 3, already described, shows a top view of an optical filter matrix structure according to prior art.
Figure 4:
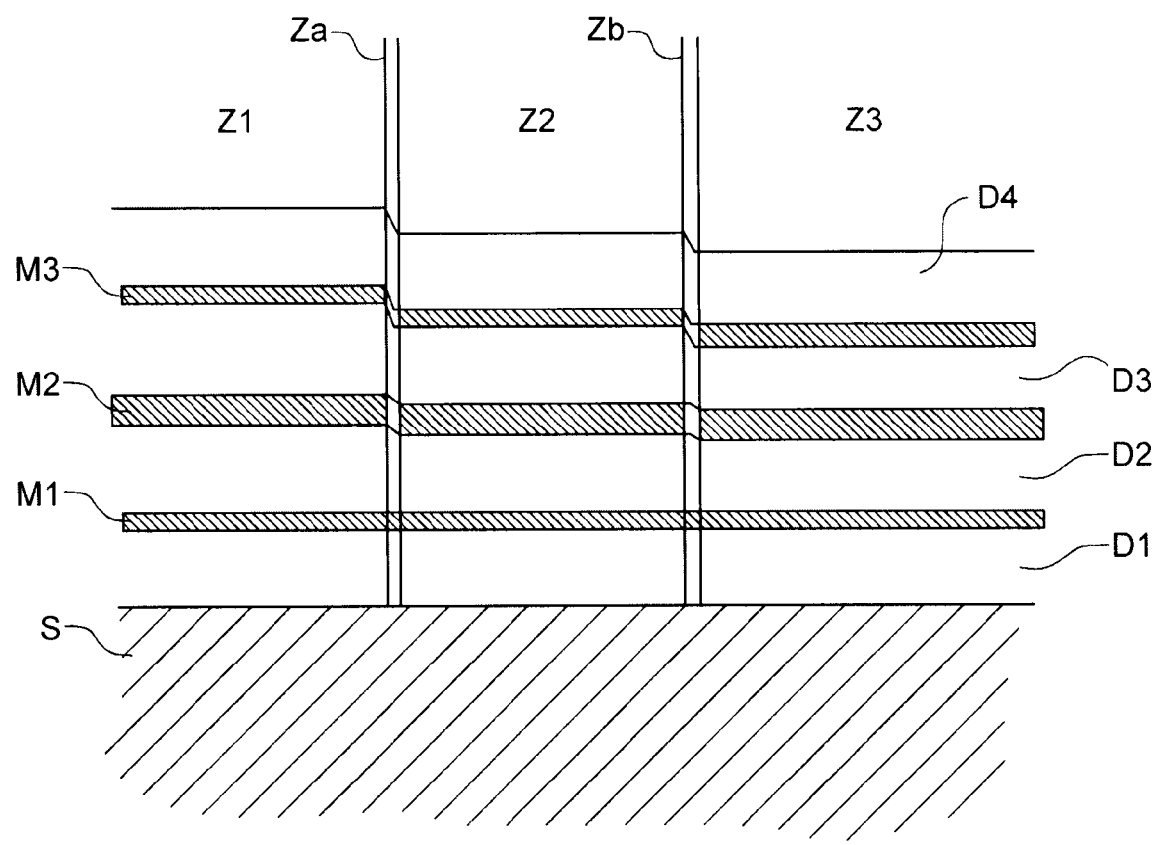
FIG. 4, already described, shows a sectional view of the optical filter matrix structure shown in FIG. 3.
Figure 5A:
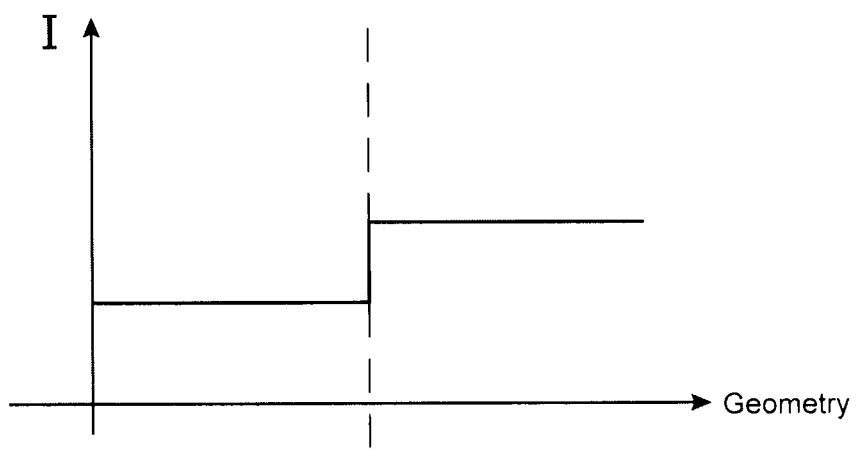
FIGS. 5A and 5B, already described, show the intensity of an optical signal transmitted by a two adjacent pixels structure as a function of the transition type existing between the two adjacent pixels.
Figure 5B:
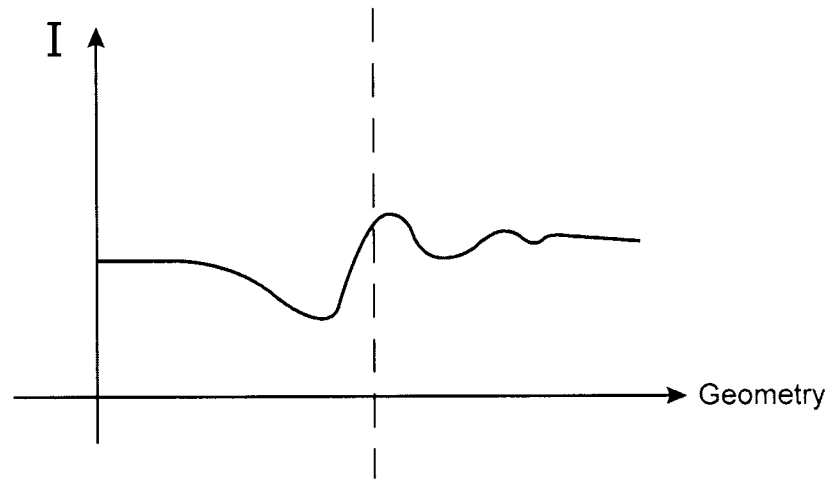
Figure 6A:
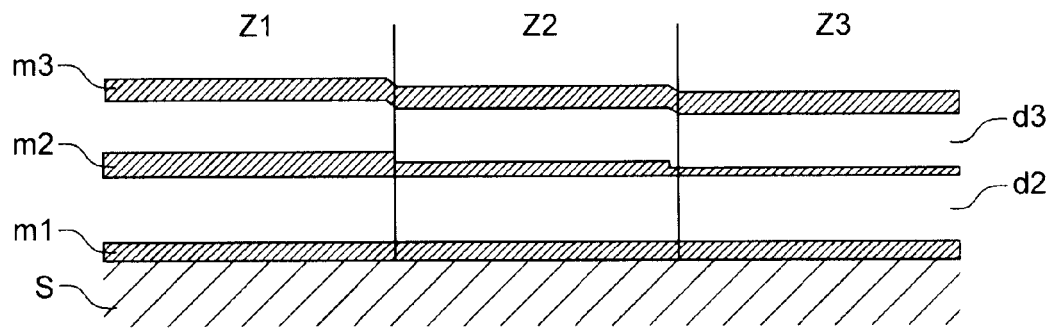
FIG. 6A shows a sectional view of a first example of an optical filter matrix structure according to the invention.

FIG. 6A shows a sectional view of a first example of an optical filter structure according to the invention.

The structure in FIG. 6A comprises two dielectric layers d2-d3 and three metallic layers m1-m3 placed on a substrate S. The layers m1, d2, m2 form a first Fabry-Pérot cavity and the layers m2, d3 and m3 form a second Fabry-Pérot cavity. The dielectric layers d2 and d3 are cavity resonators and the metallic layers m1, m2, m3 are mirrors that partially allow light to pass. According to the invention, only the central metallic layer m2 that is common to the two Fabry-Pérot cavities has a variable thickness, the two dielectric layers d2, d3 and the two metallic layers m1, m3 that surround the central layer m2 each have a constant thickness. The structure in FIG. 6A illustrates the embodiment of the invention in which the structure of the stack of dielectric layers and metallic layers is symmetric about the central metallic layer, the dielectric and metallic layers located on each side of the central metallic layer and with the same rank relative to the central metallic layer have approximately the same thickness.

The variation in thickness of the central metallic layer leads to the definition of three filter zones Z1, Z2, Z3, zone Z1 being the Blue filter zone (i.e. the zone transparent for Blue), zone Z2 the Green filter zone (i.e. the zone transparent for Green) and zone Z3 the Red filter zone (i.e. the zone transparent for Red). The variation in the thickness of the central metallic layer m2 alone creates two significant improvements, namely:

the fact that only two non-superposed layers need to be lithographed during production of the filter structure, and the fact that a very large reduction in the total variation of layer thicknesses is possible, which considerably reduces the transition artefact between adjacent pixels.

All other things being equal, the total thickness of the filter structure according to the invention is beneficially less than the total thickness of the structure disclosed in patent application FR 2 904 432 mentioned above. The basic structure corresponds to the Blue filter for which the thickness is between 180 and 300 nm depending on the structures and the dielectric materials used. The result is an advantageously ultra-thin structure.

Moreover, the structure according to the invention has all the advantages mentioned above for the structure described in patent application FR 2 904 432, namely good angular tolerance, the possibility of integrating a metallic electrode in the filter and the possibility of filtering infrared (IR) and the deep ultraviolet (deep UV).

Figure 6B:
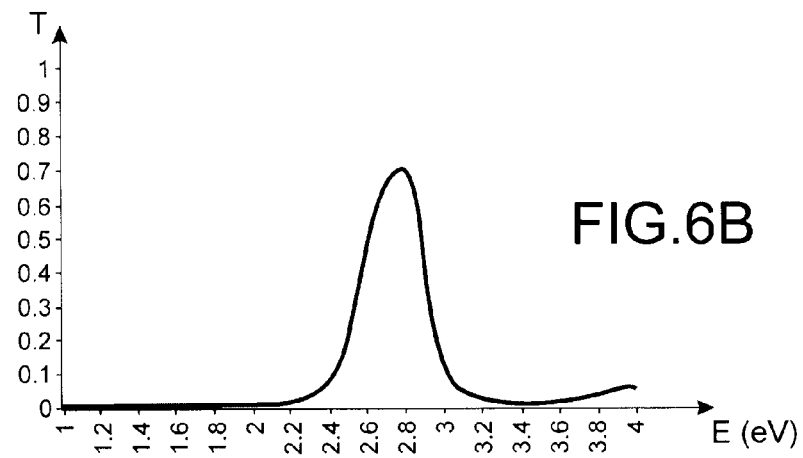
FIGS. 6B-6D illustrate the operation of an optical filter structure according to the invention conforming with FIG. 6A.
Figure 6C:
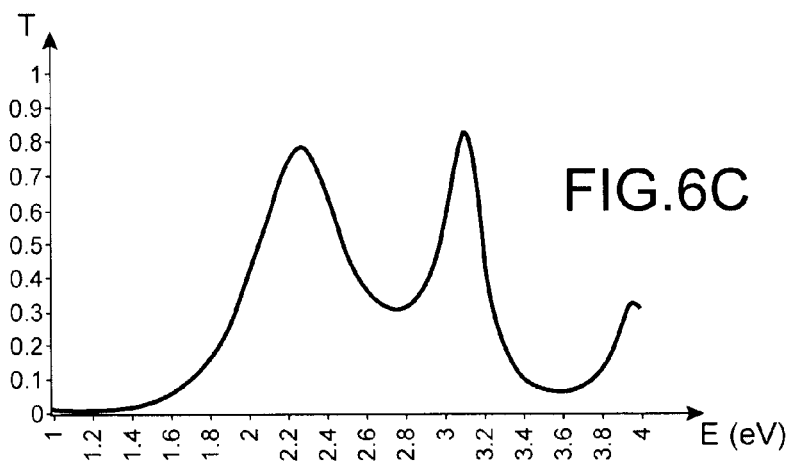
Figure 6D:
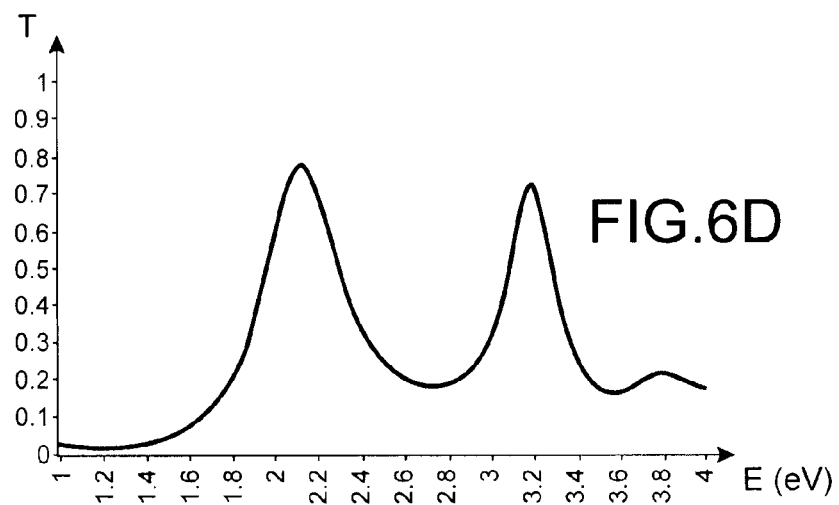

FIGS. 6B-6D show the transmission factor T of a structure conforming with FIG. 6A as a function of the energy E of photons, for different thicknesses of the central metallic layer. FIG. 6B corresponds to a case in which the central metallic layer is thick (actually 41.4 nm/zone Z1 in FIG. 6A), curve 6B corresponds to a case in which the thickness is moderate (actually 15 nm/zone Z2 on FIG. 6A) and layer 6C corresponds to the case in which the layer is thin (actually 6.5 nm/zone Z3 in FIG. 6A).

Apart from the fact that the central metallic layer behaves like a mirror, it also behaves like an optical tunnel barrier. For a thick central metallic layer (FIG. 6B), the natural modes of each of the two cavities cohabit. The result is a single frequency lobe for which the central frequency is the resonance frequency of the cavity (transmission of the colour Blue). When the thickness reduces (FIG. 6C), coupling between natural modes of the cavity increases and the result is a shift and a duplication of the frequency lobe, one of the lobes corresponding to the transmission of Green and the other to the transmission in the Ultraviolet. When the thickness reduces further (FIG. 6D), the shift and duplication increase, the visible lobe then corresponding to the transmission of Red and the other lobe to transmission in the deep Ultraviolet. Advantageously, unlike devices according to prior art for which filtering is done by varying the thickness of the dielectric layer, the filter structure according to the invention transmits in the visible range photons with approximately equal energy for each of the different colours (for example 2.7 eV) and the waves in the Infrared range are always stopped (see curves 6B-6D).

Figure 7A:
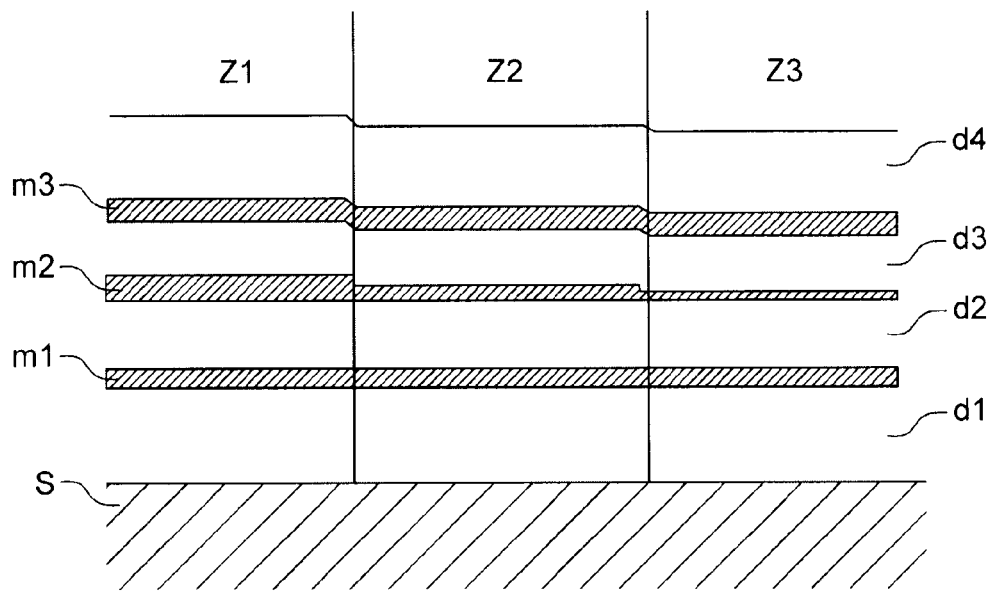
FIG. 7A shows a sectional view of a second example of an optical filter matrix structure according to the invention.

FIG. 7A shows a sectional view of a second optical filter structure example according to the invention.

FIG. 7A shows an optical filter structure that in addition to layers m1, d2, m2, d3, m3 mentioned above, also comprises two dielectric optical adaptation layers d1 and d4. A first dielectric optical adaptation layer d1 is placed between the substrate S and the metallic layer m1 and the second optical adaptation layer d4 is placed on the metallic layer m3. In the example in FIG. 7A, the thickness of the dielectric adaptation layers is constant from one elementary optical filter to another. As already mentioned, the invention also relates to the case in which the thicknesses of the dielectric optical adaptation layers are different from one elementary filter to another.

Table 2 below gives an example of numeric values for the thicknesses of the different dielectric and metallic layers in the structure in FIG. 7B as a function of the different filter zones Z1, Z2 and Z3. Notation e(di) represents the thickness of the dielectric layer di (i=1, 2, 3, 4) and notation e(mj) represents the thickness of the metallic layer mj. In the chosen example, the dielectric layers are made of titanium oxide ($TiO_2$) and the metallic layers are made of silver (Ag).

TABLE 2

| thickness | Z1 | Z2 | Z3 |
|---|---|---|---|
| e (d1) | 50.0 nm | 50.0 nm | 50.0 nm |
| e (m1) | 20.0 nm | 20.0 nm | 20.0 nm |
| e (d2) | 51.7 nm | 51.7 nm | 51.7 nm |
| e (m2) | 41.4 nm | 15.0 nm | 6.5 nm |

TABLE 2-continued

| thickness | Z1 | Z2 | Z3 |
|---|---|---|---|
| e (d3) | 51.4 nm | 51.4 nm | 51.4 nm |
| e (m3) | 20.0 nm | 20.0 nm | 20.0 nm |
| e (d4) | 49.7 nm | 49.7 nm | 49.7 nm |
| Total | 284.2 nm | 257.9 nm | 249.4 nm |

Advantageously, the total thickness of the structure according to the invention is very much less than the total thickness of a structure according to prior art with approximately the same filter performances.

Figure 7B:
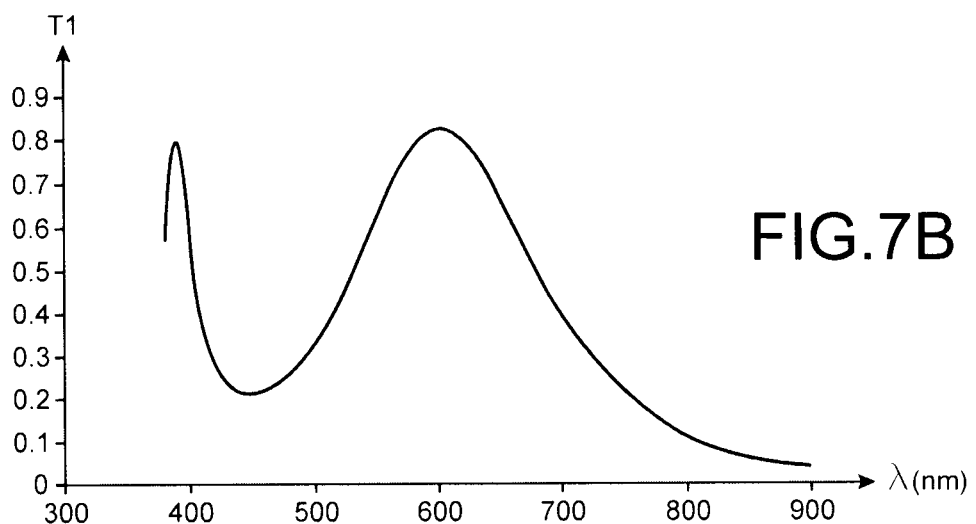
FIGS. 7B-7D show transmission curves for the Blue, Green and Red filters conforming with the structure of the invention shown in FIG. 7A, respectively.
Figure 7C:
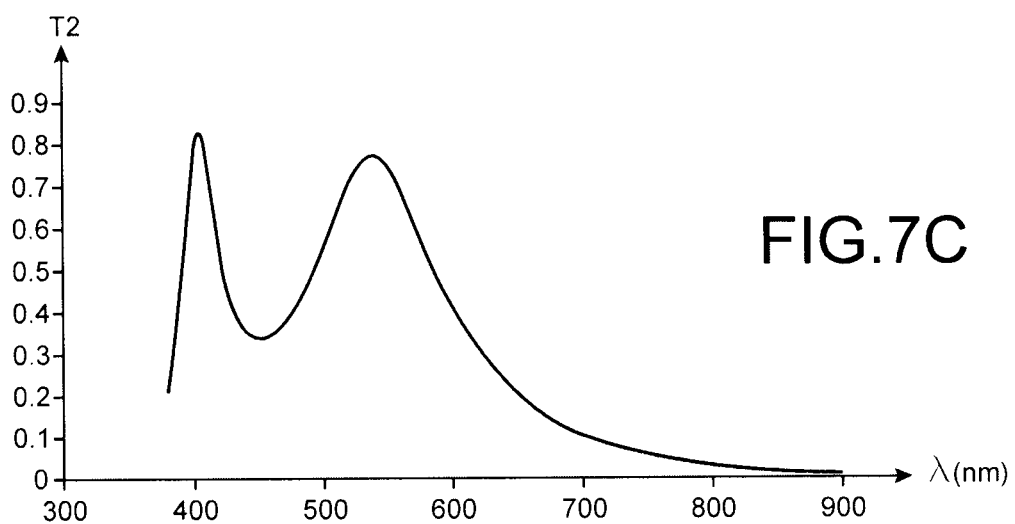
Figure 7D:
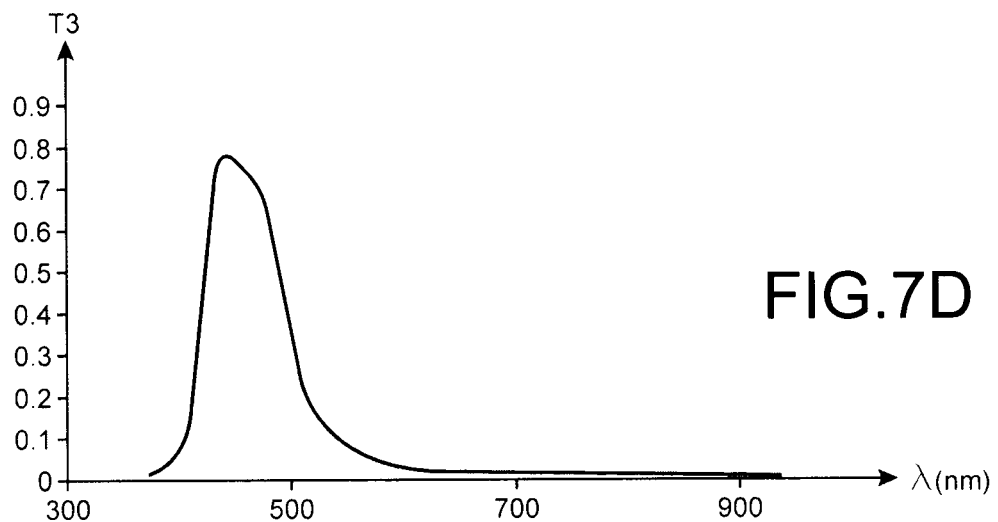

FIGS. 7B, 7C and 7D show the optical transmission factors T1, T2 and T3 of pixels with Red, Green and Blue filters respectively in the structure shown in FIG. 6B (zones Z1, Z2 and Z3) respectively as a function of the wavelength λ.

The optical transmission factor T1 of the Red filter pixel is centred on a wavelength equal to approximately 605 nm and has a peak at approximately 380 nm. The optical transmission factor T2 of the Green filter pixel is centred on a wavelength equal to approximately 540 nm and has a peak at approximately 406 nm. The optical transmission factor T3 of the Blue filter pixel is centred on a wavelength equal to approximately 450 nm.

Figure 8:
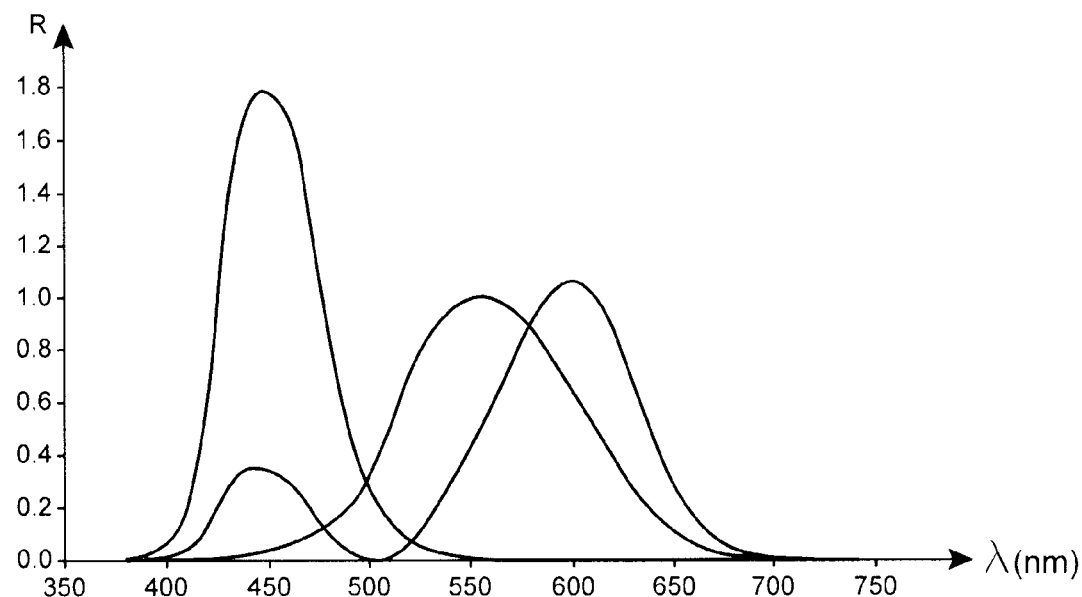
FIG. 8 shows theoretical spectral response curves given in the "IEC 1931" colorimetric standard for blue, green and red.

Advantageously, peaks of the transmission factors T1, T2, T3 at 605 nm, 540 nm and 450 nm respectively correspond approximately to the maximum values of spectral responses in standard "IEC 1931" that are considered as being colorimetric references. Spectral responses R(λ) in standard "IEC 1931" are shown in FIG. 8 as a reminder. The colorimetric response of an imager is better when the spectra of the pixels making up the imager are close to the spectra in standard "IEC 1931". Consequently, it is obvious that coloured filters according to the invention are very satisfactory in this respect.

However, the peaks of transmission factors T1 and T2 at 380 nm and 406 nm respectively are not useful. According to an improvement of the invention, means are provided to reduce the amplitude of these peaks. There are three possible means of reducing the amplitude.

Compared with a structure with a stack that is symmetric about the central metallic layer (case in which the thickness of the dielectric and metallic layers of the same rank located on each side of the central metallic layer are approximately the same (see table 2)), a first method consists of making a stack that is asymmetric about the central metallic layer. The dielectric and metallic layers located between the substrate and the central metallic layer are then thinner than the dielectric and metallic layers between the central metallic layer and the incident medium. As a non-limitative example, table 3 below shows the values of the dielectric and metallic layers in an asymmetric structure with seven layers (four dielectric layers including two dielectric optical matching layers and three metallic layers):

TABLE 3

| thickness | Z1 | Z2 | Z3 |
|---|---|---|---|
| e (d1) | 20.0 nm | 20.0 nm | 20.0 nm |
| e (m1) | 15.0 nm | 15.0 nm | 15.0 nm |
| e (d1) | 40.0 nm | 40.0 nm | 40.0 nm |
| e (m2) | 36.0 nm | 13.0 nm | 7.0 nm |
| e (d3) | 48.5 nm | 48.5 nm | 48.5 nm |
| e (m3) | 25.0 nm | 25.0 nm | 25.0 nm |
| e (d4) | 38.9 nm | 38.9 nm | 38.9 nm |
| Total | 223.4 nm | 200.4 nm | 194.4 nm |

Note that the thickness e(m3) of layer m3 is significantly greater than the thickness e(m1) of layer m1, and the same situation occurs between the metallic layers of the same rank located on each side of the central metallic layer of a structure with a larger number of metallic layers, the fact that the stack is optimised to reduce the peak in the near UV systematically leading to this characteristic.

Figure 9:
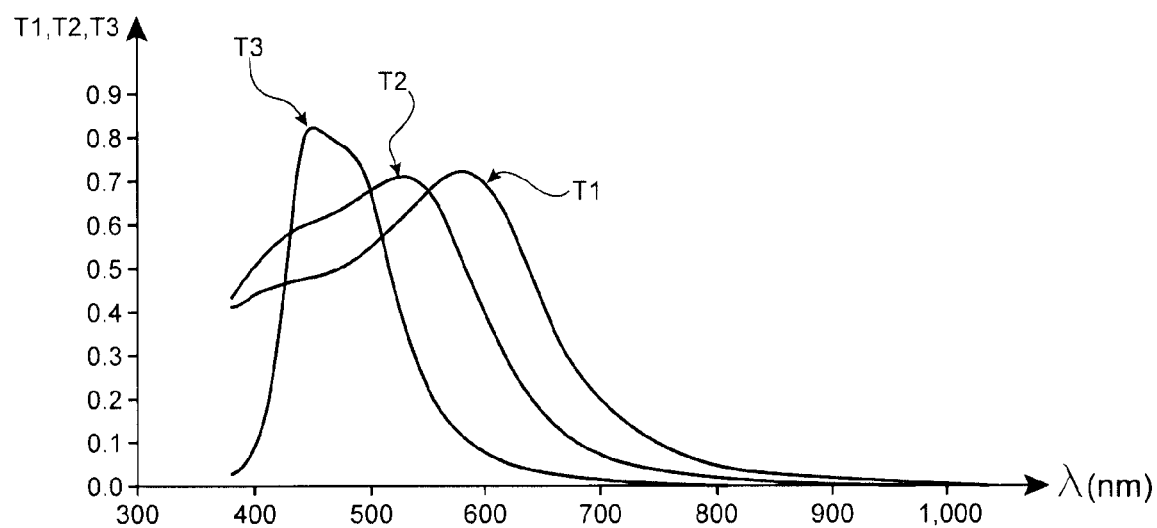
FIG. 9 shows a spectral response with attenuation of the UV-blue peak for a structure conforming with the invention.

FIG. 9 shows the transmission factors T1, T2, T3 of the Red, Green and Blue pixels of the asymmetric structure according to the invention, for which the table is given below (table 3). A genuine reduction of undesirable peaks can be observed.

A second method of reducing the amplitude of undesirable peaks is to make dielectric layers from a material for which the absorption cut-off wavelength is approximately 400 nm, for example such as zinc sulphide (ZnS).

A third method consists of using the first and second methods mentioned above simultaneously.

The optical filter structure according to the invention will be made using micro-electronic technological means known in themselves.

Preferably, the dielectric and metallic layers are deposited by cathodic spattering under vacuum, which is a "cold" process. However, other techniques such as vacuum evaporation are possible. As already mentioned above, the materials may for example be silver (Ag) for the metallic layers and titanium dioxide ($TiO_2$) for the dielectric layers. The layer thickness may for example be controlled by knowledge of the deposition rate.

We will now describe how to make a structure conforming with the structure in FIG. 7A as a non-limitative example. Four layers will be deposited in sequence as far as the metallic layer that will form the central metallic layer of the stack of layers, namely:

a first dielectric layer with a constant thickness of 20 nm (layer d1),
a first metallic layer with a constant thickness of 15 nm (layer m1),
a second dielectric layer with a constant thickness of 40 nm (layer d2), and
a second metallic layer with a constant thickness of 40 nm (layer that will be used to make layer m2).

Two lithography steps follow the four deposition steps. A resin is used to protect zones that are not to be etched. Etching is then done, for example by reactive ionic etching (for example CF4+O2 gas). For example, the etching stop point is determined by optical interferometry. For the thickness values mentioned above (see FIG. 6B and associated table 3, namely 36 nm for Blue, 13 nm for Green and 7 nm for Red), once the 36 nm thick metallic layer has been deposited, a first open mask is made on the "green" and "red" zones and etching is done on a thickness of 23 nm. The first mask is then removed and a second mask is made in which only the "red" zones are open and another etching is done on a thickness of 6 nm. The variable thickness metallic layer is then formed. The resin is then stripped, and the remaining three constant thickness layers (dielectric layer, metallic layer and dielectric layer, respectively) are then deposited using the same deposition processes as those described above.

The invention claimed is:

1. An optical filter structure comprising:
at least two adjacent elementary optical filter zones having transmission spectrums different from each other, wherein
each optical filter zone is made of a stack of n metallic layers and n-1 dielectric layers, n being an odd integer greater than or equal to 3, each metallic layer alternating with a dielectric layer such that a central layer in the slack is a metallic layer,
each dielectric layer and each metallic layer respectively extends across all optical filler zones such that a layer of a same rank counted from the central metallic layer of each optical filter zone is part, respectively, of a same dielectric layer and of a same metallic layer,
a thickness of said each dielectric layer and each metallic layer of the same rank is constant for each optical filter zone and equal for all the optical filter zones,
a thickness of the central metallic layer of each optical filter zone is constant for each optical filter zone and different between two adjacent optical filter zones, and
the thickness of the central metallic layer of an optical filler zone sets the transmission spectrum of said optical filter zone.

2. The optical filter structure according to claim 1, wherein dielectric and metallic layers symmetrically located against the central metallic layer have approximately a same thickness.

3. The optical filter structure according to claim 1, wherein thicknesses of dielectric and metallic layers symmetrically located against the central metallic layer are not the same, and thickest dielectric and metallic layers being all located on a same side of the central metallic layer.

4. An optical sensor comprising:
an optical filter structure; and
a photosensitive semiconductor substrate on which the optical filter structure is deposited, wherein
the optical filter structure is a structure according to claim 3,
a metallic layer at one end of the stack or a first dielectric adaptation layer is fixed on a first face of the photosensitive semiconducting substrate, and
thinnest dielectric and metallic layers in the stack are placed between the first face of the photosensitive semiconducting substrate and the central metallic layer.

5. The optical filter structure according to claim 1, wherein at least one metallic layer obtained by superposition of two elementary metallic layers formed from different metallic materials.

6. The optical filter structure according to claim 5, wherein metallic layers that are not formed from the two elementary metallic layers are made from silver and metallic layers obtained by the superposition of the two elementary metallic layers, comprise a metallic layer made from silver.

7. The optical filter structure according to claim 1, wherein at least one dielectric layer is obtained by superposition of at least two elementary dielectric layers formed from different materials.

8. The optical filter structure according to claim 7, wherein the dielectric layers that are not obtained by the superposition of the two elementary dielectric layers and one of the two elementary dielectric layers in each dielectric layer formed from the two elementary dielectric layers are made from one of the following materials: titanium dioxide ($TiO_2$), titanium-doped aluminium nitride (AlTiN), zinc sulphide (ZnS), Zinc sulphide-Silica alloy ($ZnS(x)$-$SiO_2(1-x)$), alumina ($Al_2O_3$), silicon nitride ($Si_xN_y$), and magnesium fluoride ($MgF_2$).

9. An optical sensor comprising:
an optical filter structure; and
a photosensitive semiconductor substrate on which the optical filter structure is deposited, wherein
the optical filter structure is a structure according to any one of claims 1 to 8, and
a metallic layer at one end of the stack or a first dielectric adaptation layer is fixed a first face of the photosensitive semiconducting substrate.

10. The optical filter structure according to claim 1 wherein a first dielectric optical adaptation layer is placed on a metallic layer located at a first end of the stack and/or a second dielectric optical adaptation layer is placed on a metallic layer located at a second end of the stack, opposite the first end.

11. The optical filter structure according to claim 10, wherein a thickness of the first dielectric adaptation layer and/or the second dielectric adaptation layer varies from at least one first optical filter zone to at least one second optical filter zone.

12. The optical filter structure according to claim 10, wherein the first and second dielectric adaptation layers are made from exactly the same material as is used for the dielectric layers.

13. An optical sensor comprising:
   an optical filter structure; and
   a photosensitive semiconductor substrate on which the optical filter structure is deposited, wherein
   the optical filter structure is a structure according to any one of claims 10 to 12, and
   a metallic layer at one end of the stack or the first dielectric adaptation layer is fixed on a first face of the photosensitive semiconducting substrate.

14. The optical filter structure according to claim 1, wherein the optical filter zones are arranged in a form of a matrix.

15. The optical filter structure according to claim 14, wherein the matrix is a Bayer matrix for filtering three colours Red, Green and Blue.

* * * * *